United States Patent [19]

Komatsu

[11] Patent Number: 5,546,407
[45] Date of Patent: Aug. 13, 1996

[54] DATA TRANSMISSION CIRCUIT FOR CHECKING OF MEMORY DEVICE

[75] Inventor: Ryogo Komatsu, Tokyo, Japan

[73] Assignee: Ando Electric Co., Ltd., Tokyo, Japan

[21] Appl. No.: 158,514

[22] Filed: Nov. 29, 1993

[30] Foreign Application Priority Data

Nov. 30, 1992 [JP] Japan .................. 4-343323

[51] Int. Cl.⁶ .................................................. G06F 11/00
[52] U.S. Cl. .................................................. 371/27
[58] Field of Search .................. 371/22.1, 22.5, 371/22.6, 27

[56] References Cited

U.S. PATENT DOCUMENTS 5,072,447  12/1991  Perloff et al. ............... 371/27

Primary Examiner—Vincent P. Canney
Attorney, Agent, or Firm—Finnegan, Henderson, Farabow, Garrett & Dunner, L.L.P.

[57] ABSTRACT

The pattern data a, b, . . . , m, which are different data, for checking a memory device, are supplied to a data selector 3 of the data selecting circuit 2 through the flip-flop FF1A. The AND circuits 5A and 5B output set clock signals S11 and S12 on the basis of the register switching signal S8 and the register set signal S7. Also, the registers 6A and 6B latch the data selecting signal S9 with the set clock signals S11 and S12 respectively, and output select instructions (data selecting signals S13 and S14) for selecting the different pattern data. When the selector 7 receives the data switching signal S5 which is latched with the time clock signal S3 of the flip-flop FF1A in the flip-flop FF1B, the data selector 7 outputs the data selecting signal S15, which then alternately becomes either the data selecting signal S13 or the data selecting signal S14, to the data selector 3. As a result, the data selector 3 alternately outputs two different pattern data to a testing pin which is attached to an electric terminal of the memory device.

5 Claims, 8 Drawing Sheets

DATA TRANSMISSION CIRCUIT FOR CHECKING OF MEMORY DEVICE

BACKGROUND OF THE INVENTION

1. Field of the Invention

The present invention relates to a data transmission circuit which is used in a testing for memory devices, wherein the data transmission circuit alternatively outputs two different signals to an electrical terminal of the memory device.

2. Prior Art

FIG. 7 is a circuit diagram of a conventional data transmission circuit. In this Figure, the data transmission circuit consists of n data selecting circuits 22 which selectively output different pattern data from data a, b, c, ... m, to each of n testing pins Pa, Pb, ..., Pn, respectively. Each of the input testing pattern data a, b, c, ..., m has a different characteristic. Pattern data signals S1a, S1b ..., S1m from a pattern generating circuit (not shown) are latched by a flip-flop FF1 according to a real time clock signal S3. Output signals S4a, S4b ..., S4m are supplied to each of the data selecting circuits 22. Each data selecting circuit 22 selects an output signal from the output signals S4a, S4b ..., S4m, and generates pattern data signals S6a, S6b ..., S6n for each of the testing pins, respectively. A data selecting circuit 22 is provided for each testing pin, and it is possible to independently select pattern data for each testing pin.

Each of the data selecting circuits 22 consists of a data selector 3 and register 6 as shown FIG. 8. The data selector 3 selects one pattern data from the pattern data a, b, c, ..., m which are designated by the output signals S4a, S4b ..., S4m, and outputs a pattern data signal S6 as the selected pattern data. The data selector 3 receives an output signal S13, as a selecting signal, from the register 6. The register 6 sets the selecting signal by latching a pattern data selecting signal S9 according to a register set clock signal S7.

However, the conventional data transmission circuit selects only one pattern data for one testing pin during a test execution. As a result, it is not possible to supply two different pattern data for the same testing pin. The operation of the test is therefore more complex and it requires more testing time.

SUMMARY OF THE INVENTION

Accordingly, it is an object of the present invention to provide a data transmission circuit which is used in a field of the measurement estimation for memory devices, wherein the data transmission circuit alternately outputs two different pattern data to an electrical terminal of the memory device. In an aspect of the present invention, there is provided a data transmission circuit for outputting pattern data, which is selected from a plurality of pattern data, to each testing pin attached to a terminal of a semiconductor device, by using a plurality of data selecting means, each of which are provided for each testing pin, wherein said data transmission circuit is comprising:

a plurality of data selecting means for selecting at least two pattern data from said plurality of pattern data, and for alternately outputting said two pattern data to said testing pins, respectively.

According to the present invention, a plurality of data selecting means selects at least two pattern data from said plurality of pattern data, and alternately outputs said two pattern data to said testing plans, respectively.

Therefore, in accordance with this invention, since a plurality of data selecting means can alternatively output two pattern data, which differ from each other, to the same testing pin which is connected to an electric terminal of the memory device, during a circuit test, the measurement estimation for the memory device, which has two different functions in an electric terminal, can be carried out in a short time and easily.

BRIEF DESCRIPTION OF THE DRAWINGS

Further objects and advantages of the present invention will be apparent from the following description, with reference being made to the accompanying drawings wherein the preferred embodiments of the present invention are clearly shown.

DESCRIPTION OF A PREFERRED EMBODIMENT

Figure 1:
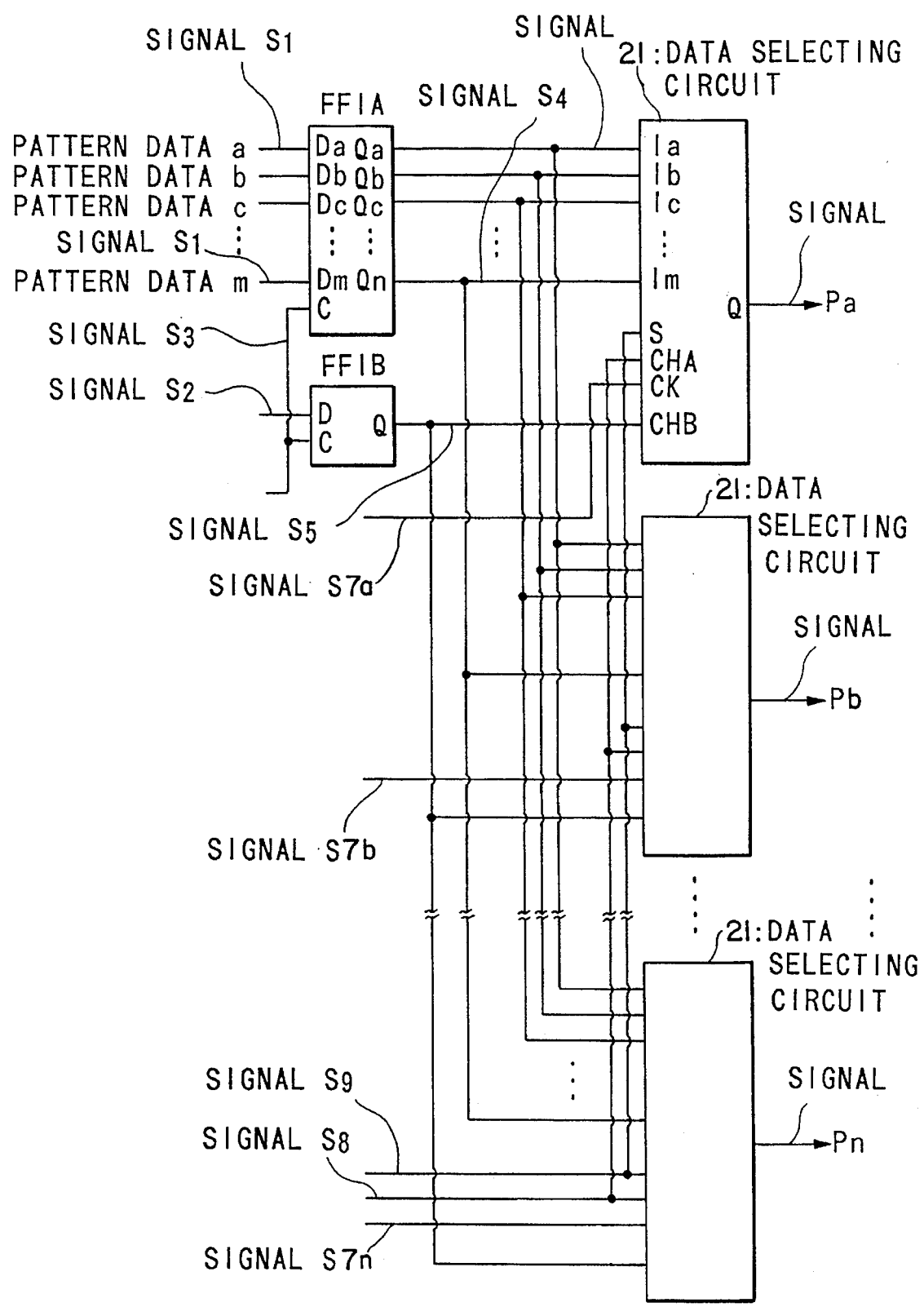
FIG. 1 is a block diagram showing the data transmission circuit for the checking of a memory device according to an embodiment of the present invention.

FIG. 1 is a block diagram showing the data transmission circuit according to an embodiment of the present invention. In FIG. 1, each data selecting circuit 21 is connected to each of the testing pins Pa, Pb, ..., Pn in order to output pattern data, and is connected in parallel to flip-flops FF1A and FF1B. The data selecting signal S9 is supplied to each of the data selecting circuits 21. The data selecting signal S9 is formed by two types of information, first information sel_a for selecting a pattern data a, and second information sel_b for selecting a pattern data b, as shown FIG. 3. The first information sel_a and the second information sel_b appear alternately in the data selecting signal S9.

Figure 2:
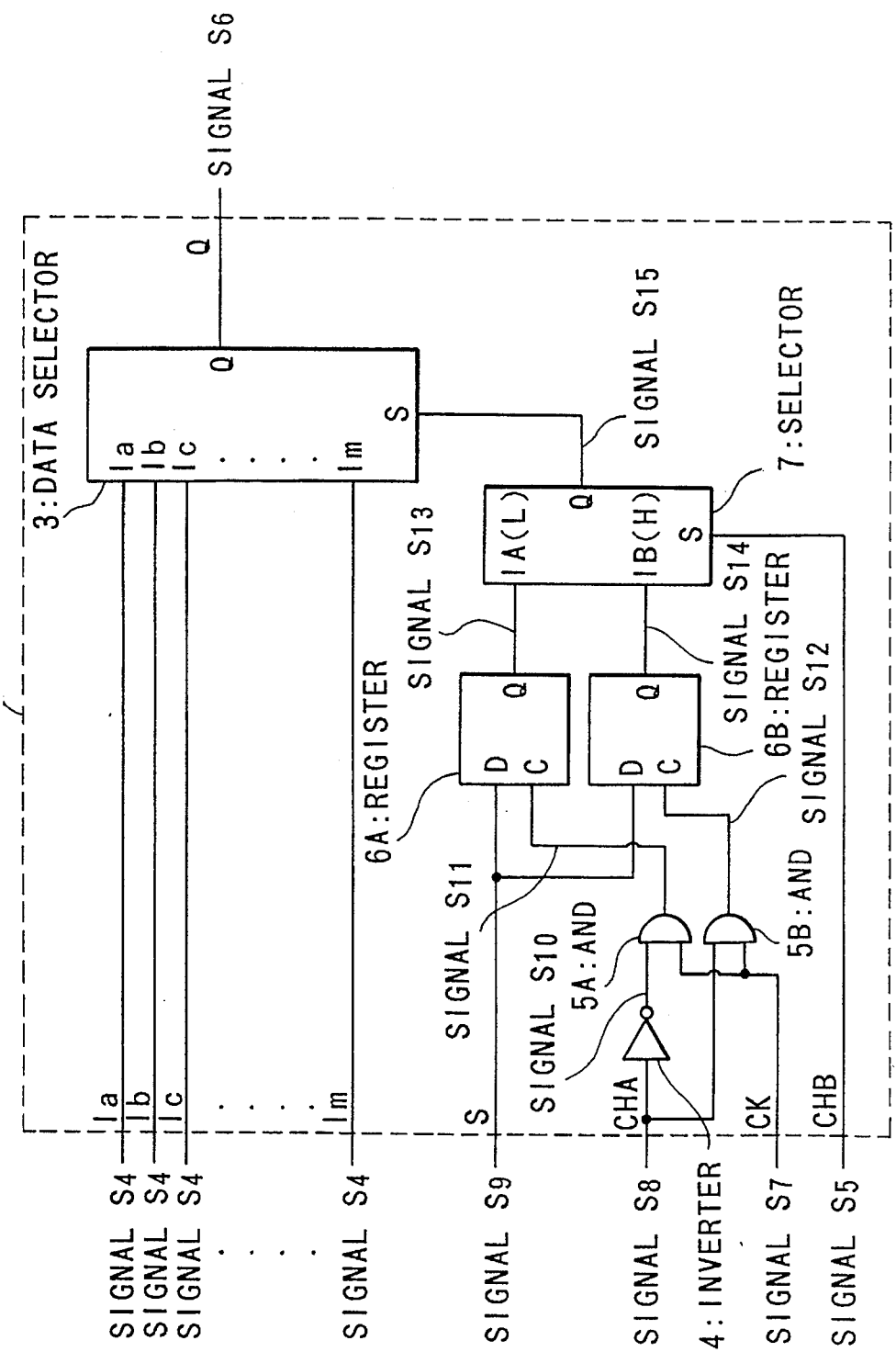
FIG. 2 is a block diagram showing the data selecting circuit according to the first embodiment of the present invention.
Figure 3:
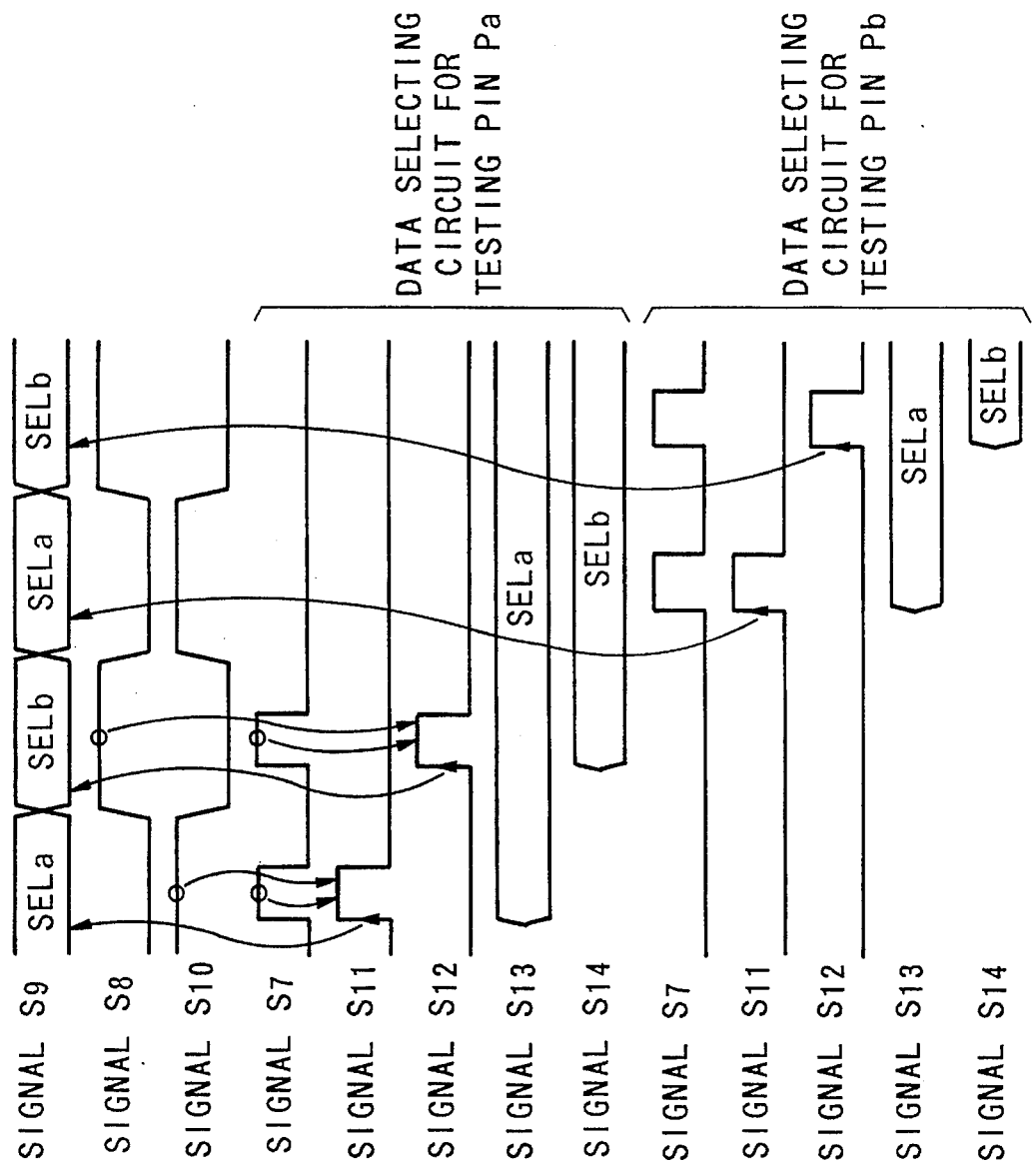
FIG. 3 is a timing chart showing some signals in the data selecting circuit according to the first embodiment.

In the data selecting circuit 21, a register set clock signal S7 is supplied to registers 6A and 6B, as a set clock signal S11 and S12, through an inverter 4 and AND circuits 5A, 5B according to the register switching signal S8, as shown FIG. 2. That is, the signal S11 is a consequence of the logical product of the signals S7 and S10, and the signal S12 is a consequence of the logical product of the signals S7 and S8. Also, the signals S11 and S12 do not synchronize at any time, as shown in FIG. 3. In addition, the signal S7 is a clock which is specific for each data selecting circuit 21.

The registers 6A and 6B latch the signal S9 according to each of the signals S11 and S12, and output the selecting signals S13 and S14 for selecting the pattern data a and b.

The selecting signals S13 and S14 maintain their own condition unless a clock pulse signal S7 is supplied.

Figure 4:
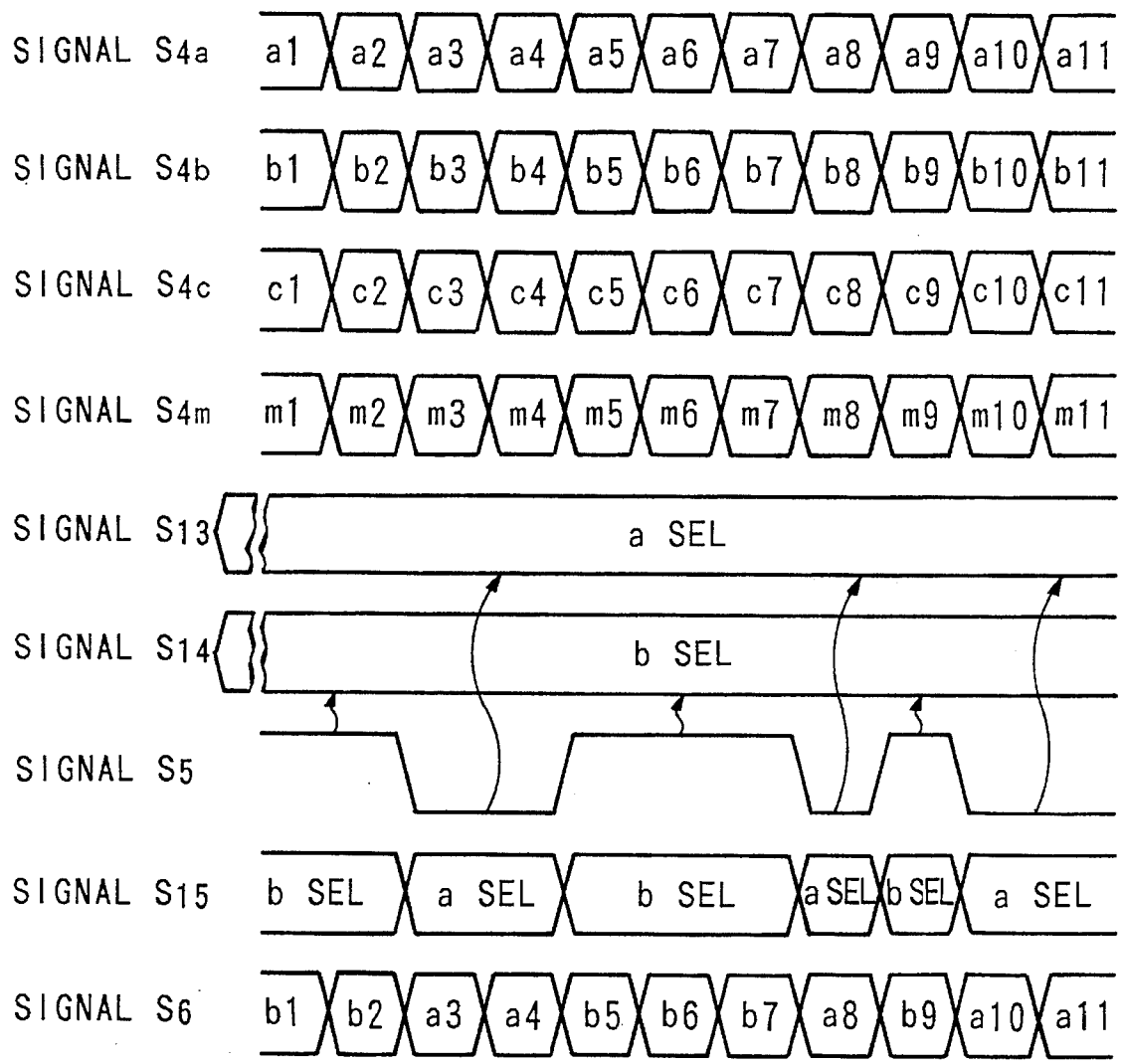
FIG. 4 is a timing chart showing some signals in the data selecting circuit according to the first embodiment.

Next, FIG. 4 is a timing chart showing a performance of the data selector 3 when it selects two kinds of pattern data from m kinds of different pattern data a, b, ..., m, and alternately outputs the two kinds of pattern data. The output signals S13 and S14 of the register 6A and 6B are input data of the selector 7, so that the selecting information a_sel and b_sel of the output signal S15 is switched by alternately and repeatedly switching selecting signal S5 which is supplied to selector 7, between "0" and "1". That is, when the signal S5 is "0", the selector 7 outputs the signal. S13 for selecting the pattern data a, as the signal S15. On the other hand, when the signal S5 is "1", the selector 7 outputs the signal S14 for selecting the pattern data b, as the signal S15.

Since the signal S15 is supplied to the selector 3 as a select signal, the output signal S6 is switched when the information of signal S15 is alternately and repeatedly switched. Therefore, the data selector 3 receives information for selecting the pattern data a from the signal S15, and then outputs the pattern data a as a signal S6. In contrant, the data selector 3 receives information for selecting the pattern data b from the signal S15, and then outputs the pattern data b as the signal S6. In this way, the data selector 3 alternately outputs the pattern data a and the pattern data b to the testing pin Pa as the testing pattern data.

In this first embodiment, the pattern data (signals S1a, S1b, ..., S1m), which form m bits data, generated in the pattern generating circuit are latched at flip-flop FF1A with the real time clock signal S3. Furthermore, the data switching signal S2 is also latched at flip-flop FF1B with the real time clock signal S3.

The output signals S4a, S4b..., S4n of the flip-flop FF1A are supplied to the data selecting circuits 21. The output signal S5 of the flip-flop FF1B is also supplied to all of the data selecting circuits 21. Each data selecting circuit 21 selects two bits (signals) from the supplied output signals S4a, S4b..., S4m, and outputs a pattern data signal S6 to each of the testing pins Pa, Pb, ..., Pn by switching alternately and repeatedly the selected two bits (signals).

In each data selecting circuit 21, the data selector 3 selects one bit (signal) from the supplied output signals S4a, S4b ..., S4m according to the selecting signal S15, and outputs the bit (signal) as a pattern data signal S6. The selecting signal S15 is outputted from the selector 7 which selects either of the output signal S13 of the register 6A or the output signal S14 of the register 6B. That is, the selecting signal S15 is the same as either of the output signals S13 or S14. Therefore, the registers 6A and 6B output two different types of selecting information as the signals S13 and S14, respectively.

The selecting information, supplied to the registers 6A and 6B, are settled by latching the data selecting signal S9 with the register set clock signals S11 and S12. Also, the signal S9 is supplied to each data selecting circuit 21. The signals S11 and S12 are generated by the AND circuits 5A and 5B, according to conditions of the register set clock signal S7 and the register switching signal S8. Furthermore, the signal S12 is obtained as a consequence of the logical product between the signals S7 and S8 in the AND circuit 5B. The signal S13 is obtained as a consequence of the logical product between the signals S11 and S7.

The signal S15 can be in two states, either in the state of signal S13 or signal S14, by alternately switching the signal S5 between "0"and "1". As a result, the two different pattern data are alternately outputted as a pattern data signal S6, to the testing pin.

Figure 5:
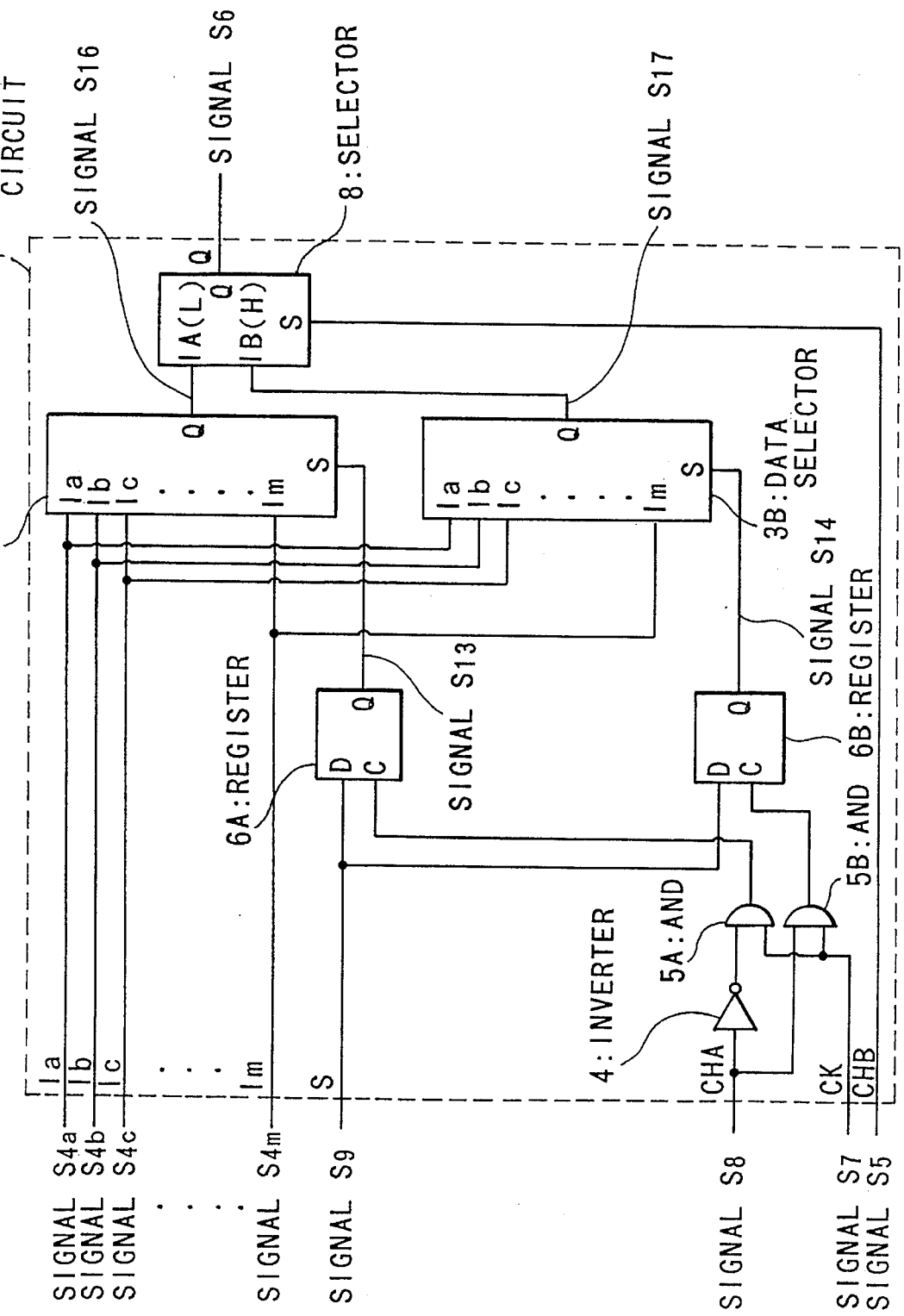
FIG. 5 is a block diagram showing the data selecting circuit according to the second embodiment of the present invention.

FIG. 5 is a block diagram showing the data transmission circuit according to second embodiment of the present invention. In FIG. 5, as in the first embodiment, the selecting signals are disposed in the data selecting circuit 21. The data selecting circuit 21 consists of two data selectors 3A and 3B. The data selectors 3A and 3B receive respectively the output signals S13 and S14 from the registers 6A and 6B, as a selecting signal, and output the signals S16 and S17 to the selector 8, respectively. When the signals S16 and S17 are supplied to the selector 8, the selector 8 selects either the signal S16 or the signal S17 on the basis of the selecting signal S5, and outputs the selected signal. In this data selecting circuit 21, it has a function which either outputs signal S16 of the data selector 3A or outputs signal S17 of the data selector 3B so that it is alternately outputted by switching, as determined by the selector 8.

Figure 6:
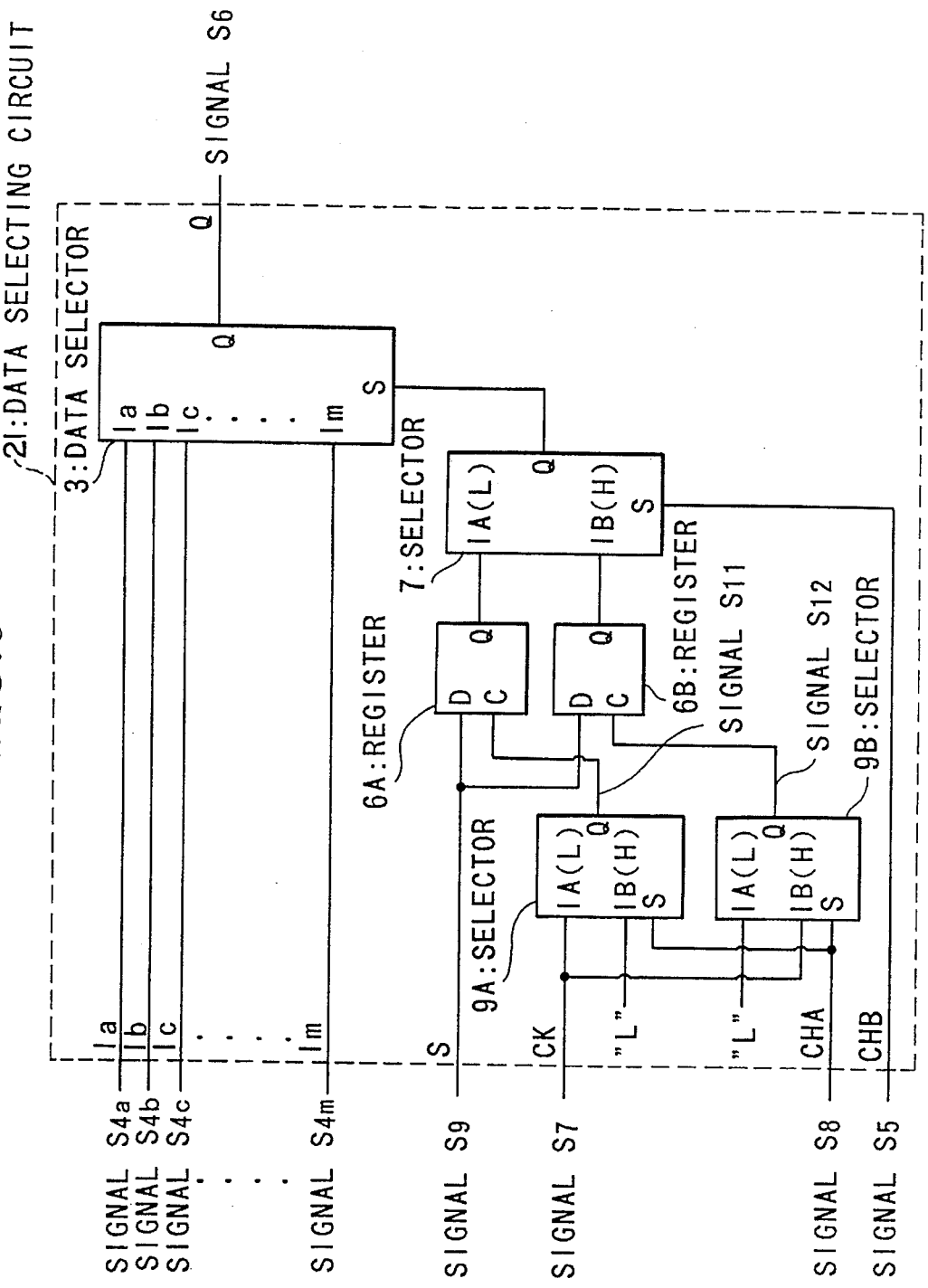
FIG. 6 is a block diagram showing the data selecting circuit according to the third embodiment of the present invention.
Figure 7:
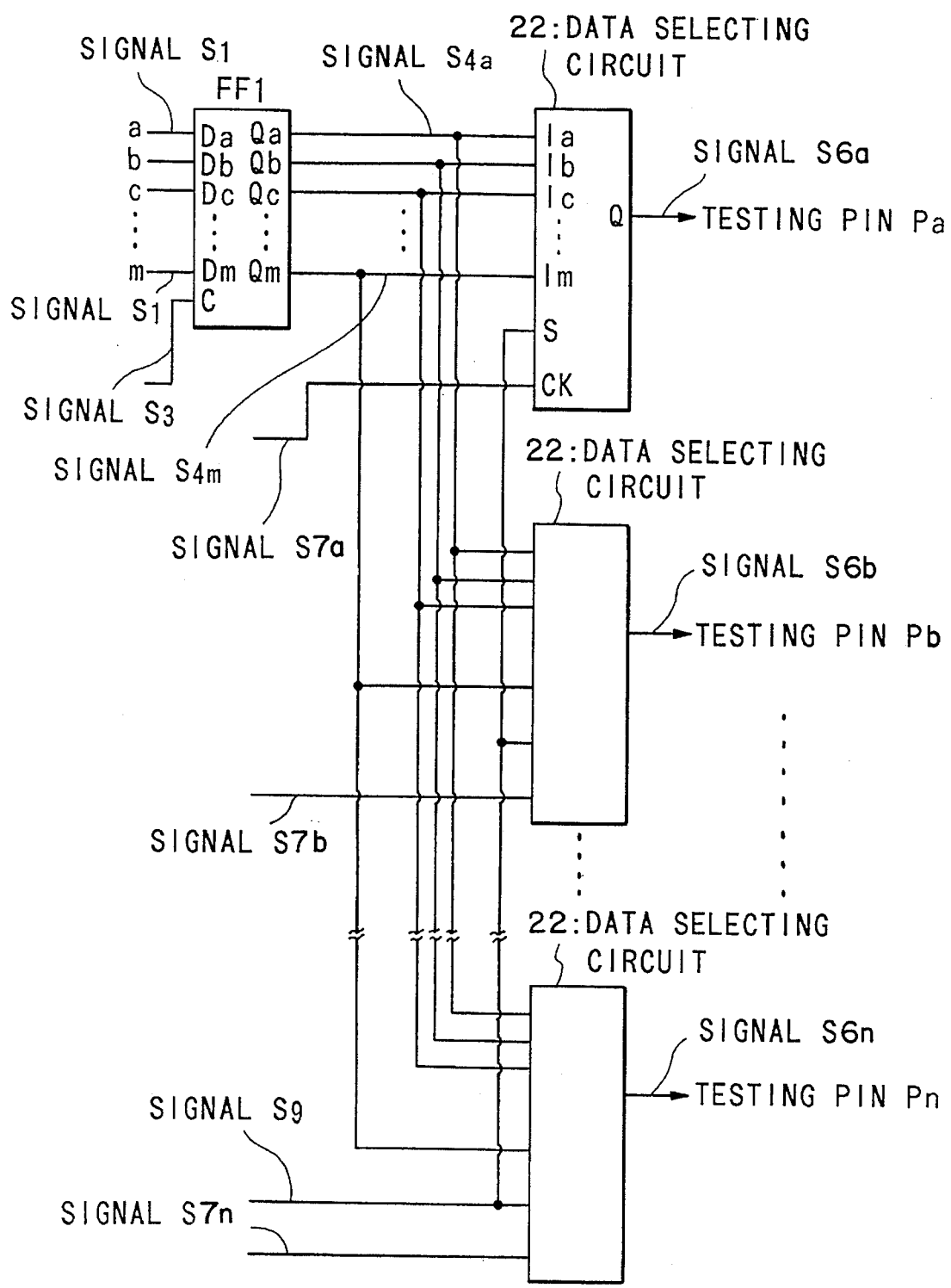
FIG. 7 is a block diagram showing the conventional data transmission circuit.
Figure 8:
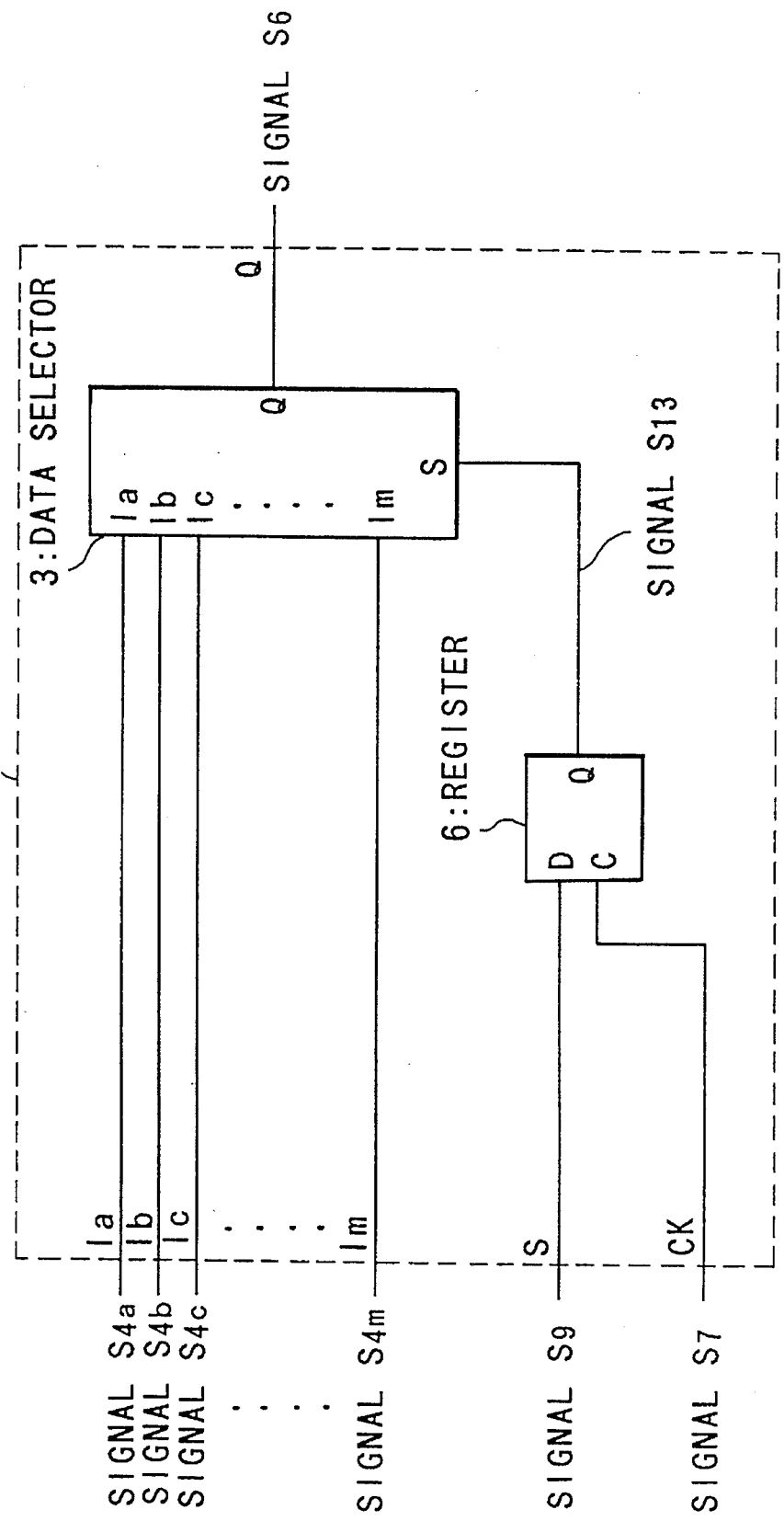
FIG. 8 is a block diagram showing the data selecting circuit of the conventional data transmission circuit in FIG. 7.

Next, FIG. 6 is a block diagram showing the data transmission circuit according to a third embodiment of the present invention. In FIG. 6, the register clock signals S11 and S12 are generated by the selectors 9A and 9B instead of the inverter 4, and the AND circuits 5A and 5B of the first embodiment.

What is claimed is:

1. A data transmission circuit for outputting selected pattern data from a plurality of pattern data to testing pins attached to a terminal of a semiconductor device, said data transmission circuit comprising:

selecting means for each said testing pin for selecting at least two pattern data from said plurality of pattern data, and;

alternating means for controlling said selection means to alternatively output said two pattern data to said testing pin.

2. The data transmission circuit according to claim 1, further comprising:

a first holding means for holding said plurality of pattern data;

a second holding means for holding a data switching signal according to a timing clock of said first holding means;

wherein said alternating means controls outputting said two pattern data according to said data switching signal from said second holding means.

3. The data transmission circuit according to claim 1, wherein said alternating means further comprises:

a first AND circuit for outputting a first set clock signal when receiving a register switching signal and a register set signal;

a second AND circuit for outputting a second set clock signal when receiving a negative signal of said register switching signal and said register set signal;

a first register for outputting a first data selecting signal having instructions for selecting a first pattern data from said plurality of pattern data by latching said data selecting signal with said set clock signal;

a second register for outputting a second data selecting signal having instructions for selecting a second pattern data from said plurality of pattern data by latching said data selecting signal with said set clock signal;

a second selecting means for alternately and repeatedly outputting to the selecting means said first data selecting signal and said second data selecting signal, as a third data selecting signal.

4. The data transmission circuit according to claim 1, wherein said alternating means further comprises:

a first AND circuit for outputting a first set clock signal when receiving a register switching signal and a register set signal;

a second AND circuit for outputting a second set clock signal when receiving a negative signal of said register switching signal and said register set signal;

a first register for outputting a data selecting signal having instructions for selecting a first pattern data from said plurality of pattern data by latching said data selecting signal with said set clock signal;

a second register for outputting a data selecting signal having instructions for selecting a second pattern data from said plurality of pattern data by latching said data selecting signal with said set clock signal;

a first data selector for selecting a first pattern data from said plurality of pattern data according to said data selecting signal, and for outputting said first pattern data;

a second data selector for selecting a second pattern data from said plurality of pattern data according to said data selecting signal, and for outputting said second pattern data.

5. The data transmission circuit according to claim 1, wherein said alternating means further comprises:

a first selector for outputting a first set clock signal when said first selector receives either a high level signal or a low level signal of a register switching signal and a register set signal;

a second selector for outputting a second set clock signal when said second selector receives either the high level signal or the low level signal of the register switching signal and the register set signal;

a first register for outputting a first data selecting signal having instructions for selecting a first pattern data from said plurality of pattern data by latching said data selecting signal with said set clock signal;

a second register for outputting a second data selecting signal having instructions for selecting a second pattern data from said plurality of pattern data by latching said data selecting signal with said set clock signal;

a selecting means for alternately and repeatedly outputting to said selecting means said first data selecting signal and said second data selecting signal, as a third data selecting signal.

* * * * *